March 22, 1966 F. F. PAULI 3,242,393

DOUBLE HEADED LEAD

Filed May 24, 1963

INVENTOR.
FRANK F. PAULI

BY

OSTROLENK, FABER, GERB & SOFFEN
ATTORNEYS 3,242,393
DOUBLE HEADED LEAD

Frank F. Pauli, Torrance, Calif., assignor to International Rectifier Corporation, El Segundo, Calif., a corporation of California Filed May 24, 1963, Ser. No. 282,971
4 Claims. (Cl. 317—234)

This invention relates to a lead construction for semiconductor devices and more specifically relates to a double headed lead which will serve as a reservoir to contain varnish in a restricted area during the manufacture of a semiconductor device.

A primary object of this invention is to provide a novel double headed lead arrangement for rectifiers which prevents leakage paths from within a hermetically sealed area to external areas thereof.

Another object of this invention is to provide a novel double headed lead arrangement for semiconductor devices which are to be hermetically sealed which gives a greater bonding surface area for the hermetically sealing compound.

A further object of this invention is to provide a novel double headed lead arrangement for semiconductor devices which will prevent the formation of varnish along the wire so that a mold can consistently grip and seal the wire during the molding operation.

Yet another object of this invention is to provide a novel well or reservoir for varnish in the lead of a semiconductor device.

These and other objects of the invention will become apparent from the following description when taken in connection with the drawings in which.

Figure 1:
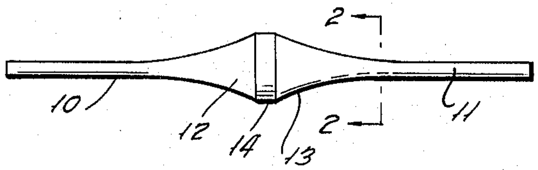
FIGURE 1 shows a plan view of a partially assembled semiconductor device manufactured according to prior art techniques.
Figure 2:
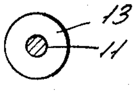
FIGURE 2 is a cross-sectional view of FIGURE 1 taken across the lines 2—2 in FIGURE 1.
Figure 3:
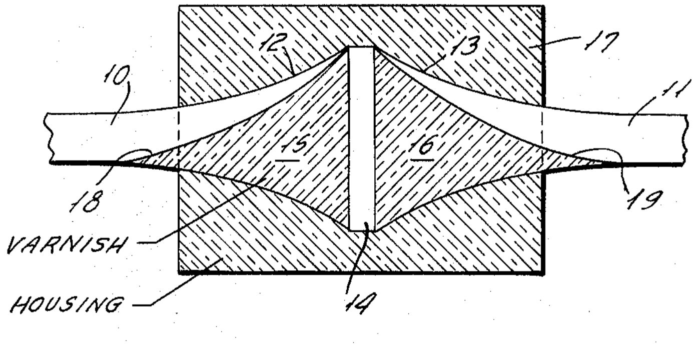
FIG. 3 (PRIOR ART)
FIGURE 3 is an expanded plan view, with portion of the hermetic sealing housing removed, of the rectifier of FIGURES 1 and 2 after a varnish treatment and a hermetic sealing operation.

Referring first to FIGURES 1 and 2, I have illustrated therein a typical lead arrangement for a semiconductor device such as a rectifier wherein two leads 10 and 11 each having expanded head portions 12 and 13 respectively, have a chip or semiconductor wafer 14 captured between their expanded ends. The wafer 14 may be of any desired type such as a silicon or germanium crystal and may have one or more junctions therein. In the past and prior to hermetically sealing the junction by a potting medium, a drop of varnish or another equivalent wafer sealing medium has been dropped on the element. Because of the shape of the leads this varnish, which is intended to seal the periphery of the wafer, has been found to flow downwardly, as indicated by the shaded areas 15 and 16 in FIGURE 3, so that there is an excess of varnish at the bottom of expanded areas 12 and 13 and a lack of varnish or other suitable sealing means at the upper portions of lead portions 12 and 13. The unit was thereafter potted in a housing 17 which is shown partially cut away in FIGURE 3 where it will be observed that the ends of the housing do not extend as far as the trailing edges of the varnish portions 15 and 16. Because of this, it was found that leakage paths existed at regions 18 and 19 from external areas of housing 17 into the wafer 14 which resulted in faulty devices.

Figure 4:
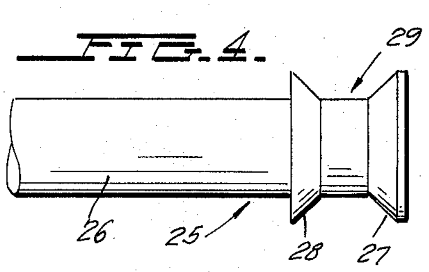
FIGURE 4 illustrates a plan view of the novel double headed lead of the invention.
Figures 5, 6, 7:
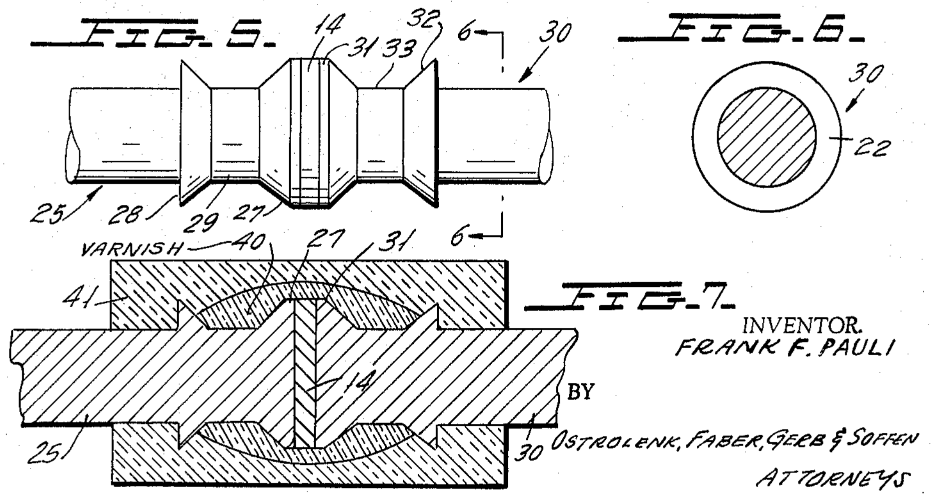
FIGURE 5 illustrates the manner in which a semiconductor element is contained between two double headed leads of the type of FIGURE 4 during the assembly of the rectifier element.
FIGURE 6 is a side cross-sectional view of FIGURE 5 taken across the lines 6—6 of FIGURE 5.
FIGURE 7 is a side cross-sectional view of the completely assembled semiconductor device using double headed leads of the present invention.

The principle of the present invention is to form the leads, such as leads 10 and 11, with a double headed arrangement or a rearwardly disposed flange as illustrated in FIGURE 4. Thus, in FIGURE 4 the lead 25 is formed with a trailing portion 26 and a double headed portion which includes a first head 27 and a second head 28. The two heads 27 and 28 define a well or reservoir 29 therebetween. In using a lead of the type of FIGURE 4, two such leads, lead 25 and an identical lead 30, are arranged as shown in FIGURE 5 with the wafer 14 captured between their opposing surfaces. The double headed lead 30 has head portions 31 and 32 which define a well or reservoir 33 as shown, whereby there are two reservoirs on either side of wafer 14.

The two reservoirs act, as illustrated in FIGURE 7, to force the formation of a varnish bead 40 which completely surrounds wafer 14 and heads 27 and 31 of leads 25 and 30 respectively. That is to say, during manufacture a drop of varnish is placed on the subassembled leads 25, 30 and wafer 14 with the wells or reservoirs 29 and 33 forcing the formation of a bead as illustrated in FIGURE 7. Thereafter, the assembly may be potted in an appropriate housing 41 where the housing 41 is in complete intimate contact with the outwardly extending portions of leads 25 and 30 to thereby positively prevent the presence of leakage paths around the leads.

As a further unexpected advantage of the invention, it has been found that the arrangement of FIGURE 7 provides a greater bonding surface to the potting medium 41 so that improved hermetic seals are formed. Moreover, and during the molding operation, which proceeds with mass production techniques, it has been further found that the molds can grip the wire more consistently since the ends of the mold will never be exposed to a partial varnish coating such as varnish coatings 15 and 16 in FIGURE 3 which run into the mold gripping region.

In a particular embodiment of the invention, leads 25 and 30 may be formed of silvered conductive members having a diameter of 0.030 inch which flares out to 0.072 inch for the head diameters of heads 27 and 28 or heads 31 and 32. The spacing between the heads may be of the order of 0.035 inch for each of the leads to form a well having a length of the order of 0.100 inch. The wafer 14 may then have a diameter of the order of 0.072 and a thickness of 0.008. In assembling the device appropriate soldering techniques may be utilized for soldering wafer 14 to the end surfaces of conductors 25 and 30 with the soldered subassembly taking the form shown in FIGURE 5. After the varnish coating is applied and has hardened, the assembly is placed in an appropriate mold so that a potting housing such as housing 41 of FIGURE 7 can be applied to the assembly. This housing could, for example, be formed of any appropriate epoxy resin or the like.

Although I have described preferred embodiments of my novel invention, many variations and modifications will now be apparent to those skilled in the art, and I prefer therefore to be limited not by the specific disclosure herein but only by the appended claims.

The embodiments of the invention in which an exclusive privilege or property is claimed are defined as follows:

1. A semiconductor device comprising a semiconductor wafer having a first and second lead extending from a first and second adjacent surfaces thereof; each of said first and second leads having a flat end for engaging their said respective surface of said wafer; each of said leads having an extending head portion closely spaced from their said flat ends; said extending head portions being spaced from their said respective flat ends by a distance of the order of magnitude of the diameter of said first and second leads respectively; said flat end of each of said leads comprising a second extending head portion; said extending head portion and said second extending head portion of each of said leads defining respective first and second annular wells adjacent to said first and second surfaces of said wafer.

2. The device of claim 1 wherein said wafer is surrounded by an impervious bead; said impervious bead having the ends thereof contained within said first and second annular wells respectively.

3. The device of claim 2 wherein said impervious bead is formed of varnish.

4. The device of claim 2 wherein said extending head portions, and said impervious bead are hermetically contained in a common potting medium.

References Cited by the Examiner

UNITED STATES PATENTS

| | | | |
|---|---|---|---|
| 1,869,162 | 7/1932 | Miner | 339—218 |
| 2,443,513 | 6/1948 | Quackenbush | 339—218 |
| 2,468,845 | 5/1949 | Thompson | 317—234 |
| 3,081,374 | 3/1963 | Burch | 317—234 X |

FOREIGN PATENTS

| | | |
|---|---|---|
| 1,234,296 | 5/1960 | France. |

RICHARD M. WOOD, *Primary Examiner.*